United States Patent

Ohori et al.

[11] Patent Number: 6,025,607
[45] Date of Patent: Feb. 15, 2000

[54] THIN-FILM TRANSISTOR AND LIQUID CRYSTAL DISPLAY DEVICE

[75] Inventors: Tatsuya Ohori, Tokyo; Michiko Takei, Kanagawa; Hongyong Zhang, Kanagawa; Yuugo Goto, Kanagawa, all of Japan

[73] Assignee: Semiconductor Energy Laboratory Co., Ltd., Kanagawa-ken, Japan

[21] Appl. No.: 08/842,301

[22] Filed: May 5, 1997

[30] Foreign Application Priority Data

May 8, 1996 [JP] Japan .................................. 8-139459

[51] Int. Cl.$^7$ ....................... H01L 29/786; H01L 31/0392
[52] U.S. Cl. ............................. 257/72; 257/435; 349/42; 349/43
[58] Field of Search ................... 257/72, 435; 349/42–44

[56] References Cited

U.S. PATENT DOCUMENTS

| 5,371,398 | 12/1994 | Nishihara | 257/72 |
| 5,410,164 | 4/1995 | Katayama et al. | 257/72 |
| 5,412,493 | 5/1995 | Kunii et al. | 359/59 |
| 5,650,636 | 7/1997 | Takemura et al. | 257/72 |

*Primary Examiner*—Jerome Jackson, Jr.

[57] ABSTRACT

A polysilicon pattern constituting an active portion of a TFT is formed on a substrate so as to be curved to generally assume a U shape, and a gate pattern is formed as a straight conductor pattern. The gate pattern is so disposed as to cross the U-shaped polysilicon pattern plural times. The silicon pattern comprise a plurality of channel regions and impurity regions of which alignment is symmetrical.

14 Claims, 4 Drawing Sheets

THIN-FILM TRANSISTOR AND LIQUID CRYSTAL DISPLAY DEVICE

BACKGROUND OF THE INVENTION

1. Field of the Invention

The present invention generally relates to a liquid crystal display device, and particularly to a thin-film transistor used in a liquid crystal display device and the like.

2. Description of Related Art

The liquid crystal display device is widely used as a display device of a portable (or lap-top) information processing apparatus. Recently, attempts to use the liquid crystal display device as a high-resolution color display device of a stationary (or desk-top) information processing apparatus have started.

Among several types of liquid crystal display devices, the active matrix liquid crystal display device, in which an individual pixel is driven by a thin-film transistor (TFT), is suitable for attaining the above-mentioned high-resolution color display. The active matrix driving method can eliminate crosstalk between pixels which may occur in the passive matrix driving method, and hence can provide superior display performance. In the active matrix driving method, TFTs are arranged on one of the glass substrates that constitute a liquid crystal panel and each TFT controls a voltage applied to a corresponding, transparent pixel electrode.

In the active matrix liquid crystal display device, TFTs are formed on a glass substrate, and therefore an amorphous silicon pattern or a polycrystal silicon (i.e., polysilicon) pattern is used as an active layer such as a channel layer, which is in contrast to the case of a usual transistor formed on a single crystal silicon substrate. Although polysilicon has a higher carrier mobility than amorphous silicon and hence is suitable for a TFT, it substantially has a higher defect density than single crystal silicon because it includes grain boundaries etc. in the crystal structure. As a result, a polysilicon TFT tends to have a large leak current.

To minimize such leak current, in many cases the LDD (lightly doped drain) structure is used in TFTs of a liquid crystal display device. In the LDD structure, a portion of a drain region adjacent to a channel region is given a somewhat lower impurity concentration and the degree of electric field concentration on the channel region is reduced by allowing an electric field to develop in the above portion.

To further reduce the leak current, the polysilicon TFT is provided with the multi-channel gate structure in which two TFTs are connected together in series.

FIG. 3 shows an example of a conventional multi-channel gate TFT, which is a simplified version of a TFT proposed in Y. Matsueda, M. Ashizawa, S. Aruga, H. Ohshima, and S. Morozumi, "New Technologies for Compact TFT LCDs with High-Aperture Ratio, SID 90 Digest, pp. 315–318.

Referring to FIG. 3, the TFT includes a polysilicon pattern 11 formed on a glass substrate 10 that constitutes a liquid crystal panel, and a gate bus pattern 12 formed above the polysilicon pattern 11. The gate bus pattern 12 is formed with branches 12A and 12B that cover the polysilicon pattern 11. The polysilicon pattern 11 constitutes an active portion of the TFT and doped with an n-type or p-type impurity excluding the portions covered with the branches 12A and 12B. That is, in the polysilicon pattern 11, first and second channel regions are formed so as to correspond to the portions covered with the branches 12A and 12B, respectively, and diffusion regions serving as source and drain regions are formed on both sides of each channel region.

The gate bus pattern 12 is made of Al or Al alloy each of which has low resistivity. The TFT further includes a data bus pattern 13 that is formed in a level higher than the gate bus pattern 12 and is also made of Al or Al alloy. One end of the polysilicon pattern 11 is connected to the data bus pattern 13 at through contact hole 11a. The other end of the polysilicon pattern 11 is connected to a transparent pixel electrode 14 through a contact hole 11b.

In the TFT having the above configuration, a drive voltage that is supplied via the data bus pattern 13 is applied to the transparent pixel electrode 14 under the control of a gate voltage that is supplied via the gate bus pattern 12, thereby causing a variation in the orientation of corresponding liquid crystal molecules. Since the first and second channel regions that correspond to the branches 12A and 12B are formed in series, the leak current during an off-state of the transistor is very small, allowing high-contrast display. The leak current can further be reduced by forming LDD regions as mentioned above immediately outside the first and second channel regions.

However, the following problems occur in forming LDD regions in the multi-channel gate TFT concerned. That is, since the gate bus pattern 12 has a complex shape including the branches 12A and 12B, ion implantation to form diffusion regions in the polysilicon pattern 11 likely becomes non-uniform. For example, in the case of the FIG. 3 structure, if ions are implanted into the polysilicon pattern 11 by using the gate bus pattern 12 as a mask, a shadow occurs in a region between the branches 12A and 12B and the impurity concentration tends to be lower there.

In the multi-channel gate TFT in which the gate bus pattern 12 has the branches 12A and 12B, a mask is used in an ion implantation step for forming LDD structures. If a mask alignment error occurs in this ion implantation step, resulting LDD regions on the right and left sides of each gate will have different lengths.

FIGS. 4A to 4C illustrate the problem caused by a mask alignment error in the ion implantation step. FIG. 4A is a plan view showing the main part of the FIG. 3 structure, FIG. 4B is a sectional view showing formation of LDD regions in the polysilicon pattern 11 in the FIG. 4A structure in the ideal case where no mask alignment error occurs, and FIG. 4C is a sectional view showing formation of LDD regions in a case where a mask alignment error occurs.

Referring to FIG. 4A, a step of forming LDD regions in the polysilicon pattern 11 by ion implantation will be described below. After masks 15A and 15B that are a little wider than the branches 12A and 12B are formed on the branches 12A and 12B, p-type or n-type ions are implanted through the masks ISA and 15B at a given dose, so that diffusion regions 11A to 11C to become source and drain regions of the TFT are formed in the polysilicon pattern 11 as shown in the sectional view of FIG. 4B. After the masks 15A and 15B are removed, ion implantation is performed at a lower dose, so that LDD regions 11D to 11G on both sides of the branches 12A and 12B of the gate bus pattern 12. FIGS. 4B and 4C are sectional views taken along line A-A' in FIG. 4A.

As seen from FIG. 4B, an oxide film 11a is formed on the polysilicon pattern 11 and the branches 12A and 12B of the gate bus pattern 12 are formed on the oxide film 11a. It is also seen that a first channel region $CH_1$ and a second channel region $CH_2$ are formed in the polysilicon pattern 11 right under the branches 12A and 12B, respectively.

As shown in FIG. 4B, where the masks 15A and 15B are ideally aligned with the branches 12A and 12B and hence with the channel regions $CH_1$ and $CH_2$ formed thereunder, the LDD regions 11D to 11G have a given length $L_{DD}$. However, as shown in FIG. 4C, where the masks 15A and 15B are deviated from the channel regions $CH_1$ and $CH_2$, the LDD regions 11D and 11F located on the left side of the branches 12A and 12B, respectively, have an increased length $L_{DD}+d$ while the LDD regions 11E and 11G on the opposite side have a decreased length $L_{DD}-d$. In other words, in the multi-channel gate TFT of FIG. 4C, the LDD regions on the right and left sides of each gate have different lengths, so that device characteristics obtained with positive and negative drain voltages become asymmetrical.

Further, in the conventional TFT shown in FIGS. 3 and 4A to 4C, the LDD regions need to be shielded from light by a light-interrupting film to prevent an increase in leak current. Therefore, in the TFT under consideration, a light-interrupting mask for shielding the LDD regions 11D to 11G needs to be provided separately from a conventionally provided light-interrupting mask for shielding the gate bus pattern 12. However, the provision of the additional light-interrupting mask reduces the aperture ratio, resulting in darker images displayed.

SUMMARY OF THE INVENTION

Therefore, a general object of the present invention is to provide a novel and useful thin-film transistor that is free of the above-described problems, as well as a liquid crystal display device using such thin-film transistors.

A specific object of the invention is to provide a polysilicon thin-film transistor having LDD structures which is simple in configuration, in which device characteristics obtained with positive and negative drain voltages do not become asymmetrical even if a mask alignment error occurs in an ion implantation step for forming the LDD structures, and which can provide a liquid crystal panel having a large aperture ratio. Another specific object of the invention is to provide a liquid crystal display device using such thin-film transistors.

To attain the above objects, according to the invention, there is provided a thin-film transistor comprising a gate pattern being a straight conductor pattern; and a silicon pattern formed on a substrate so as to cross the gate pattern plural times, the silicon pattern comprising channel regions formed in respective regions where the silicon pattern crosses the gate pattern; a pair of first diffusion regions formed on both sides of each of the channel regions; and a curved portion provided between two ends of the silicon pattern so as to cross the gate pattern.

The silicon pattern may be curved between the two ends so as to assume a U shape.

The silicon pattern may further comprise, adjacent to and on both sides of each of the channel regions, second diffusion regions having a lower impurity concentration than the pair of first diffusion regions.

According to another aspect of the invention, there is provided a liquid crystal display device comprising thin-film transistors arranged on a substrate in array form, each of the thinfilm transistors comprising a gate pattern being a straight conductor pattern; and a silicon pattern formed on the substrate so as to cross the gate pattern plural times, the silicon pattern comprising channel regions formed in respective regions where the silicon pattern crosses the gate pattern; a pair of diffusion regions formed on both sides of each of the channel regions; and a curved portion provided between two ends of the silicon pattern so as to cross the gate pattern.

The liquid crystal display device may further comprise a straight light-interrupting pattern formed on the substrate so as to extend to cover the gate pattern.

DETAILED DESCRIPTION OF THE PREFERRED EMBODIMENT

Figure 1A:
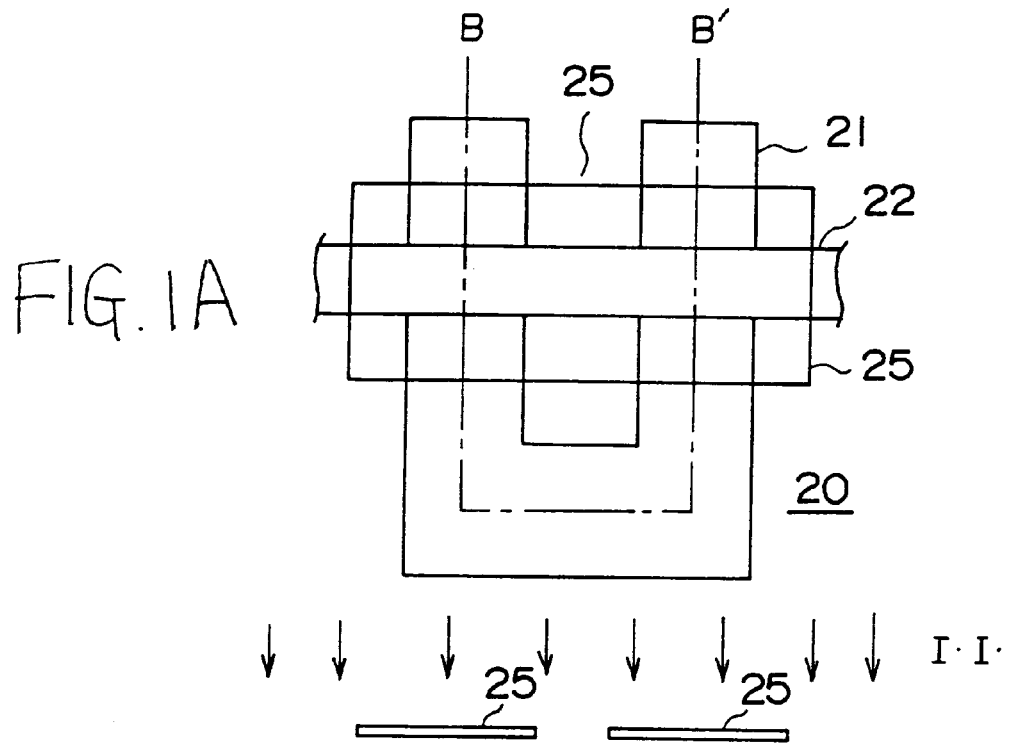
FIGS. 1A to 1C illustrate the principle of the present invention.
Figure 1B:
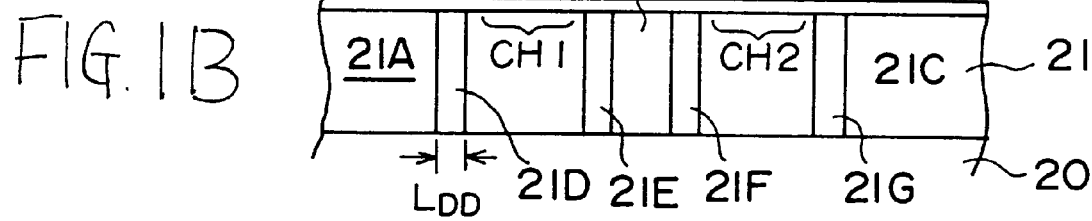
Figure 1C:
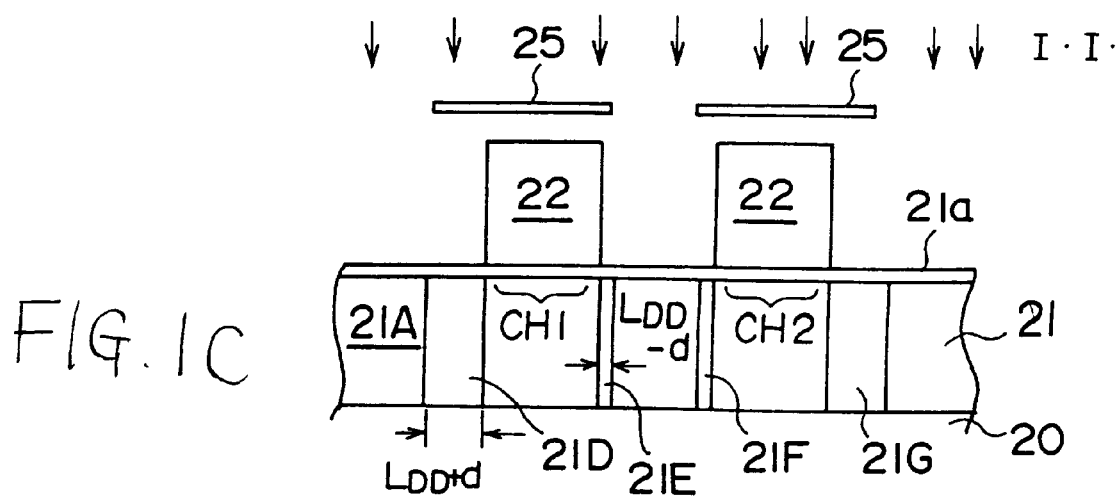
Figure 4A:
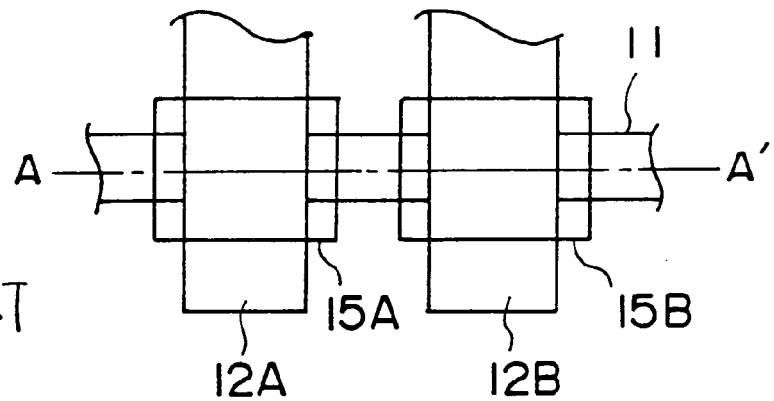
FIGS. 4A to 4C illustrate a problem of the TFT of FIG. 3.
Figure 4B:
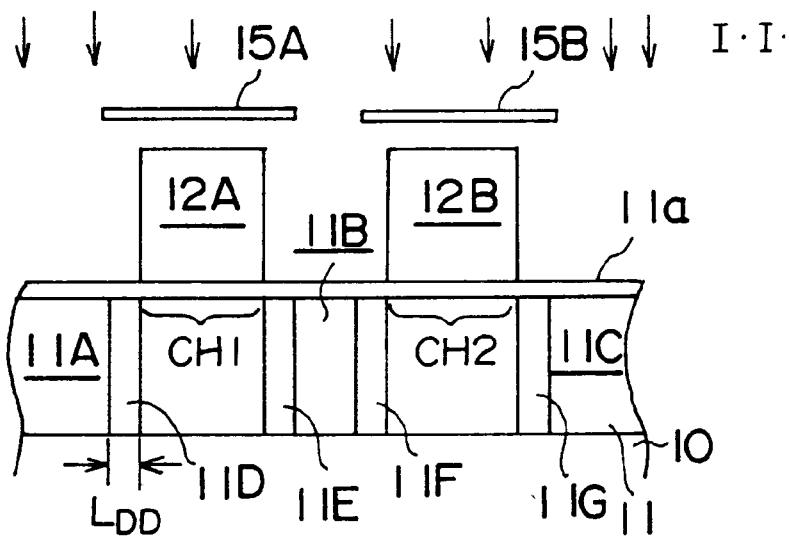
Figure 4C:
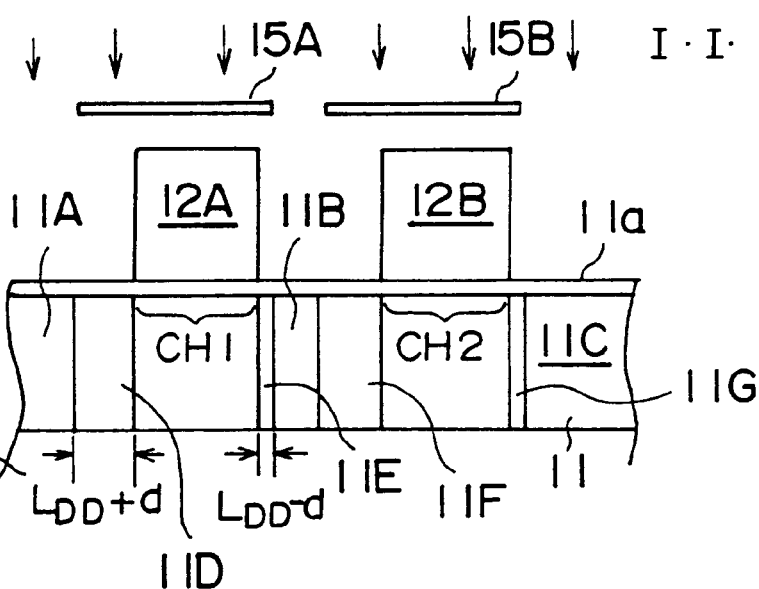

The principle of the present invention will be hereinafter described with reference to FIGS. 1A to 1C. FIG. 1A is a plan view corresponding to FIG. 4A. FIGS. 1B and 1C are sectional views corresponding to FIGS. 4B and 4C, in which FIG. 1B shows an ideal case without any mask alignment error and FIG. 1C shows a case with a mask alignment error.

Referring to FIG. 1A, a TFT includes a polysilicon pattern 21 that is formed on a glass substrate 20 constituting a liquid crystal panel and is so curved as to assume a U shape, and a straight gate bus pattern 22 formed above the polysilicon pattern 21. The polysilicon pattern 21 is doped with an n-type or p-type impurity excluding the portions where the polysilicon pattern 21 crosses the gate bus pattern 22. In other words, in the polysilicon pattern 21, first and second channel regions are formed so as to correspond to the portions where the polysilicon pattern 21 crosses the gate bus pattern 22, and p-type or n-type diffusion regions serving as source and drain regions are formed on both sides of each channel region.

In the above configuration, since the polysilicon pattern 21 is so curved as to assume a U shape, the polysilicon pattern 21 has two crossing portions with the gate bus pattern 22, i.e., two channel regions, as described above. Accordingly, in the polysilicon pattern 21, first and second TFTs corresponding to the first and second channel regions, respectively, are connected to each other in series. As a result, the leak current during an off-state of the transistor is very small, allowing high-contrast display. The leak current can further be reduced by forming LDD regions as mentioned above immediately outside the first and second channel regions.

Referring to FIG. 1A, n-type or p-type diffusion regions as source and drain regions of the above-mentioned first and second TFTs are formed in the polysilicon pattern 21 excluding regions covered with a mask 25. As shown in the sectional view of FIG. 1B, by again performing ion implantation after removing the mask 25, LDD regions 21D and 21E, and LDD regions 21F and 21G are formed adjacent to channel regions $CH_1$ and $CH_2$, respectively, which correspond to the gate bus pattern 21. The LDD regions 21D to 21G have a length $L_{DD}$. FIG. 1B is a sectional view taken along line B-B' in FIG. 1A of a TFT with the ideal alignment of the mask 25.

As seen from FIG. 1B, an oxide film 21a is formed on the polysilicon pattern 21, and the straight gate bus pattern 22 crosses the above polysilicon pattern 21 at the channel regions $CH_1$ and $CH_2$.

Where the mask 25 is deviated in the plan view of FIG. 1A, the LDD regions 21D to 21G are formed as shown in FIG. 1C. If the mask 25 is deviated upward in FIG. 1A, the LDD regions 21D and 21G have an increased length $L_{DD}$+d while the LDD regions 21E and 21F have a decreased length $L_{DD}$–d. Conversely, if the mask 25 is deviated downward in FIG. 1A, the LDD regions 21D and 21G have a decreased length $L_{DD}$–d while the LDD regions 21E and 21F have an increased length $L_{DD}$+d.

As seen from FIG. 1C, variations in the lengths of the LDD regions caused by a mask alignment error as described above are symmetrical in the TFT having, as the active region, the polysilicon pattern 21 that is so curved as to assume a U shape as shown in FIG. 1A. As a result, even if a mask alignment error occurs, operating characteristics of the multi-channel gate TFT obtained with positive and negative drain voltages do not become asymmetrical.

Further, in the TFT having the straight gate bus pattern, there occur almost no influences of a shadow in the ion implantation step. In addition, an additional light-interrupting mask as needed in the configuration of FIGS. 3 and FIGS. 4A to 4C is no longer necessary, whereby the aperture ratio of a liquid crystal display device can be increased.

Figure 2:
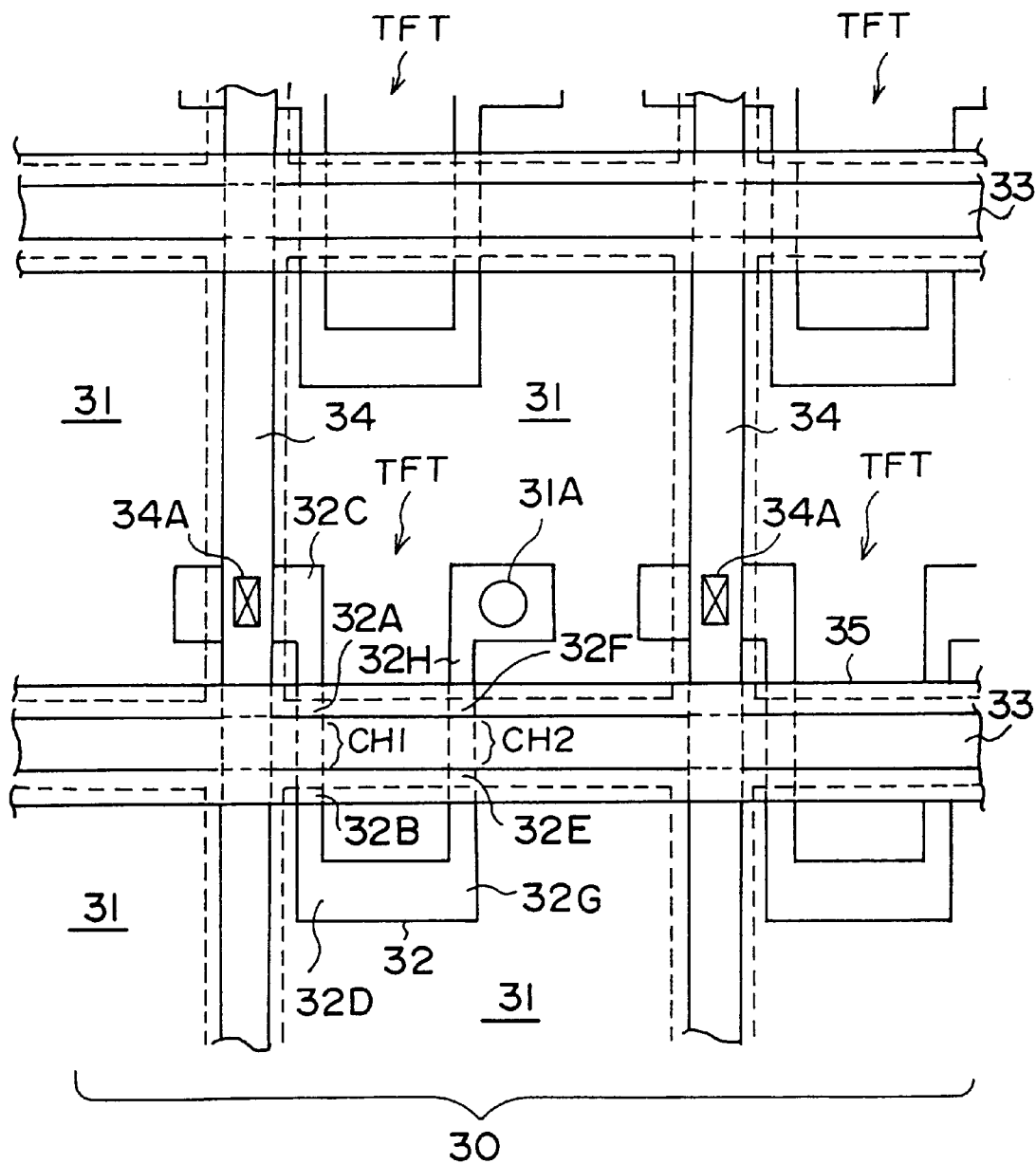
FIG. 2 shows the main part of a liquid crystal display device according to an embodiment of the invention.
Figure 3:
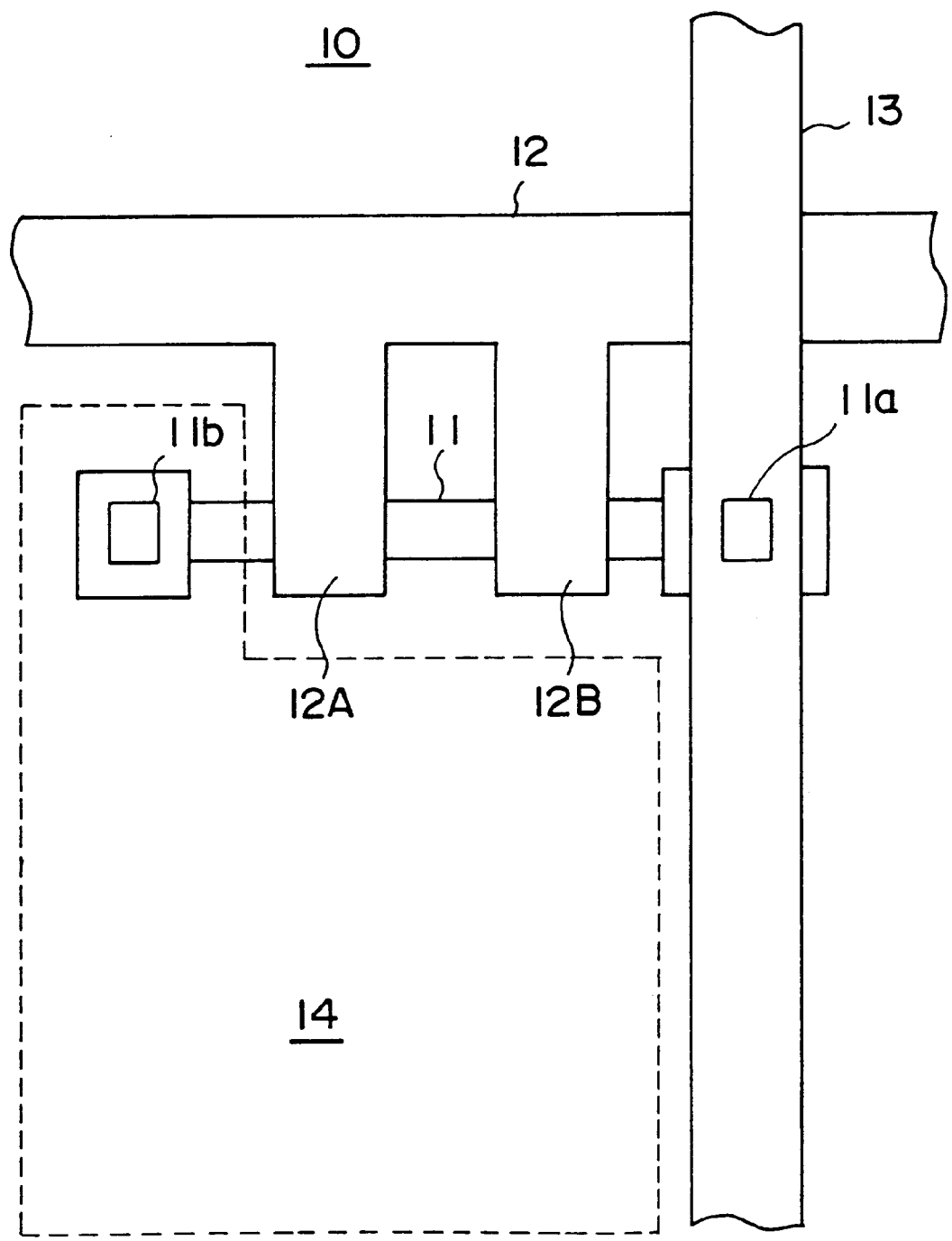
FIG. 3 shows the configuration of a conventional multi-channel gate TFT.

FIG. 2 shows the main part of a liquid crystal display device according to an embodiment of the invention.

Referring to FIG. 2, a liquid crystal display device includes transparent pixel electrodes 31 arranged in matrix form on a glass substrate 30 and TFTs provided corresponding to the respective pixel electrodes 31 to drive those. Each TFT includes a generally U-shaped polysilicon pattern 32 formed on the glass substrate 30 and a gate bus pattern 33 made of Al or Al alloy and formed on the glass substrate 30 so as to extend in the row direction. The gate bus pattern 33 crosses over the polysilicon pattern 32. In the polysilicon pattern 32, first and second channel regions $CH_1$ and $CH_2$ are formed at the portions where it crosses the gate bus pattern 33. LDD regions 32A and 32B are formed immediately outside the first channel region $CH_1$, and n-type or p-type diffusion regions 32C and 32D are formed outside the LDD regions 32A and 32B. The diffusion region 32C, which serves as a drain region of the TFT, is connected through a contact hole 34A to a data bus pattern 34 that is made of Al or Al alloy and formed in a wiring layer level higher than that of the gate bus pattern 33.

Similarly, LDD regions 32E and 32F are formed immediately outside the second channel region $CH_2$, and a diffusion region 32G that is continuous with the diffusion region 32D is formed outside the LDD region 32E and a diffusion region 32H serving as a source region of the TFT is formed outside the LDD region 32F. The diffusion region 32H is connected through a contact hole 31A to the pixel electrode 31 that is formed in a wiring layer level higher than that of the data bus pattern 34. As usual, the pixel electrode 31 may be a transparent conductive oxide film such as an ITO film.

Further, in the illustrated liquid crystal display device, a light-interrupting mask 35 for optically shielding the LDD regions 32A, 32B, 32E, and 32F is formed along the gate bus pattern 33. The light-interrupting mask 35 also serves as an ordinary light-interrupting mask 35 that is formed along the gate bus pattern 33 to prevent light from leaking through an opening between the gate bus pattern 33 and the pixel electrode 31. Therefore, it is no longer necessary to form a separate light-shielding mask that is needed in the conventional LDD multi-channel gate TFT shown in FIGS. 3 and 4A to 4C. As a result, the liquid crystal display device of FIG. 2 is improved in aperture ratio, thereby enabling bright, high-contrast display.

As already described in connection with FIGS. 1A to 1C, in the TFT having the above configuration, even if a mask alignment error occurs in forming the LDD regions 32A, 32B, 32E and 32F, their lengths vary in a symmetrical manner. Therefore, operating characteristics of the multi-channel gate TFT itself obtained with positive and negative drain voltages do not become asymmetrical. Thus, although the multi-channel gate TFT of FIG. 2 has the LDD structures, it is advantageous in that it can be manufactured easily at a low cost.

Further, in the liquid crystal display device of FIG. 2, since the gate bus pattern 33 extends straight rather than has branches as in the case of FIGS. 3 and 4A to 4C, there is only a low possibility that a shadow is formed during ion implantation, and hence an impurity can be introduced correctly at a desired dose.

According to the invention, in a multi-channel gate TFT, a gate pattern is formed as a straight conductor pattern, and a silicon pattern constituting an active portion of the TFT is so formed as to have a curved portion between diffusion regions so that the gate pattern crosses the silicon pattern plural times. As a result, even if a mask alignment error occurs in forming LDD regions in the silicon pattern by ion implantation, it does not cause any adverse effects on the device operating characteristics. By using a light-interrupting mask for shielding the LDD regions from light also as an ordinary light-shielding mask to be formed along the gate pattern, no additional light-shielding mask is needed, whereby the aperture ratio of a liquid crystal display device can be increased. Further, by forming the gate pattern as a simple, straight conductor pattern, no shadow occurs during ion implantation unlike the case of using a complex gate pattern. This assures uniform ion implantation.

What is claimed is:

1. A thin-film transistor comprising:
   a semiconductor pattern formed over a substrate comprising a plurality of channel regions and a plurality of first diffusion regions formed on both sides of each of said channel regions, said semiconductor pattern having at least one curved portion;
   a gate pattern which is a straight conductor pattern and is placed to cross said semiconductor pattern plural times;
   a source line connected with a first one of said first diffusion regions; and
   a pixel electrode connected with a second one of said first diffusion regions,
   wherein at least a third one of the first diffusion regions is disposed between said first one and second one of the first diffusion regions,
   wherein said semiconductor pattern further comprises, between each channel region and each first diffusion region, a plurality of second diffusion regions having a lower impurity concentration than said first diffusion regions,
   wherein two of said second diffusion regions, which are contiguous to said first and second ones of the first diffusion regions, respectively, have a same width, and
   wherein said width of said two second diffusion regions is larger than widths of others of the second diffusion regions.

2. A thin-film transistor according to claim 1, wherein said semiconductor pattern is formed in a U shape.

3. A thin-film transistor according to claim 1, wherein said semiconductor pattern comprises crystalline silicon.

4. A thin-film transistor according to claim 1 wherein said plurality of first diffusion regions are impurity regions and said plurality of second diffusion regions are LDD regions.

5. A thin-film transistor according to claim 1 wherein an arrangement of said channel, first diffusion, and second diffusion regions in said semiconductor pattern is symmetrical.

6. A semiconductor device comprising:
   a plurality of thin-film transistors arranged on a substrate in matrix form, each of the thin-film transistors comprising:
   a semiconductor pattern formed over a substrate comprising a plurality of channel regions, a plurality of impurity regions, and a plurality of LDD regions, each of said impurity regions disposed adjacent to one of said channel regions with one of said LDD regions interposed therebetween, said semiconductor pattern having at least one curved portion;
   a gate pattern which is straight conductor pattern arranged to cross said semiconductor pattern plural times;
   a source line connected with a first one of said impurity regions; and
   a pixel electrode connected with a second one of said impurity regions,
   wherein at least a third one of said impurity region is disposed between said first one and second one of the impurity regions, and
   wherein two of the LDD regions which are contiguous to said first and second ones of the impurity regions, respectively, are a same width different from others of the LDD regions in the semiconductor pattern.

7. A device according to claim 6, further comprising a straight light-interrupting pattern extending to cover throughout said gate pattern and said plurality of LDD regions.

8. A semiconductor device comprising:
   a plurality of thin-film transistors arranged on a substrate in matrix form, each of the thin-film transistors comprising:
   a semiconductor pattern comprising crystalline silicon formed over a substrate comprising a plurality of channel regions, a plurality of first diffusion regions formed on both sides of each of said channel regions, and a plurality of second diffusion regions having a lower impurity concentration than said first diffusion regions, each second diffusion region formed between one of said channel region and one of said first diffusion region, said semiconductor pattern having at least one curved portion;
   a gate pattern which is a straight conductor pattern arranged to cross said semiconductor pattern plural times;
   a data pattern connected with a first one of said first diffusion regions;
   a pixel electrode connected with a second one of said first diffusion regions; and
   a straight light-interrupting pattern extending to cover throughout said gate pattern and said plurality of second diffusion regions,
   wherein said data pattern and said gate and straight light-interrupting patterns cross at right angles, and
   wherein two of the second diffusion regions, one contiguous to said first one of the first diffusion regions and one contiguous to said second one of the first diffusion regions, respectively, have a same width different from widths of others of the second diffusion regions in the semiconductor pattern.

9. A device according to claim 8 wherein an arrangement of said channel, first diffusion, and second diffusion regions in said semiconductor pattern is symmetrical.

10. A device according to claim 8, wherein the width of said two of the second diffusion regions is larger than widths of others of the second diffusion regions.

11. A device according to claim 8, wherein said semiconductor pattern comprises crystalline silicon.

12. A device according to claim 8, wherein said semiconductor pattern is formed in a U shape.

13. A device according to claim 6, wherein said gate pattern comprises aluminum.

14. A device according to claim 6, wherein said semiconductor pattern is formed in a U shape.

* * * * *